(12) United States Patent
Culler

(10) Patent No.: US 7,173,496 B2
(45) Date of Patent: Feb. 6, 2007

(54) ON-CHIP VARIABLE OSCILLATOR METHOD AND APPARATUS

(75) Inventor: Jason H. Culler, Livermore, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/266,863

(22) Filed: Nov. 4, 2005

(65) Prior Publication Data

US 2006/0055474 A1 Mar. 16, 2006

Related U.S. Application Data

(62) Division of application No. 10/664,720, filed on Sep. 17, 2003, now Pat. No. 6,995,521.

(51) Int. Cl.
*H03L 7/08* (2006.01)

(52) U.S. Cl. .......................................... 331/57; 327/161

(58) Field of Classification Search .................. 331/57; 327/161

See application file for complete search history.

(56) References Cited

U.S. PATENT DOCUMENTS

| | | | |
|---|---|---|---|
| 5,068,628 A | 11/1991 | Ghoshal | |
| 5,517,155 A | 5/1996 | Yamauchi et al. | |
| 6,114,917 A | 9/2000 | Nakajima et al. | |
| 6,542,040 B1 | 4/2003 | Lesea | |
| 6,803,826 B2 | 10/2004 | Gomm et al. | |
| 6,812,799 B2 * | 11/2004 | Kirsch | 331/57 |

\* cited by examiner

*Primary Examiner*—Joseph Chang

(57) ABSTRACT

A method and apparatus for creating a variable frequency-oscillating signal on a semiconductor device. The frequency of a ring oscillator is varied by inserting or removing additional delay into the ring. The frequency of the oscillating signal is periodically compared to an encoded input signal indicating the desired frequency. The comparison result modifies the desired frequency by modifying the amount of delay in the ring oscillator. In an alternate embodiment, an input reference clock is converted to an encoded representation of the input reference clock's current frequency. This resultant encoded representation is compared to the encoded representation of the variable frequency-oscillating signal to determine whether the delay in the ring oscillator should be modified so the frequency of the variable oscillating signal matches the frequency of the input reference clock.

18 Claims, 7 Drawing Sheets

US 7,173,496 B2

ON-CHIP VARIABLE OSCILLATOR METHOD AND APPARATUS

This application is a divisional of application Ser. No. 10/664,720, filed Sep. 17, 2003, now U.S. Pat. No. 6,995,521 pending.

BACKGROUND OF THE INVENTION

1. Field of the Invention

The present invention relates to ring oscillator circuits for generating variable frequencies. More particularly, the present invention relates to ring oscillator circuits for test chips used for evaluation purposes wherein the oscillator frequency may be varied.

2. Description of Related Art

Oscillators are well known in the art and important in providing clock signals in digital logic circuits. Clock generation for semiconductor devices can take many forms including ring oscillators, crystal controlled oscillators, external clock devices, Phase Locked Loops (PLL) on a semiconductor device, Delay Locked Loops (DLL) on a semiconductor device, and various combinations of the above. Crystal controlled oscillators are generally useful for precisely creating a desired frequency, but cannot directly produce the very high frequencies required in some high performance circuitry. Similarly, external clock generators vary greatly in precision and frequency, but they are generally designed to maintain a precise fixed frequency and create global clocks for distribution within a system. As a result, external clock generators tend to be expensive.

Generally, expensive clock generators generate high frequency clocks on a system board and maintaining a clean clock signal at high frequencies is problematic. To overcome this problem, many semiconductor devices use PLL's, which create internal clocks at higher frequencies generally multiples of a lower frequency external reference clock. To be accurate, yet flexible enough to generate a large variety of frequencies, PLL's can be difficult to design. PLL's generally require analog circuit design techniques, and may still not provide the flexibility required for a test chip where varying the frequency of the clock is valuable in analyzing various performance parameters of a test chip.

DLL's may also be used to create clock multiples for an internal clock signal from a lower frequency clock reference. Some DLL's do not require analog circuitry but generally have the same problems of design complexity and lack of flexibility as a PLL solution. However, DLLs are also often used to create phase shifts in an internal clock on a semiconductor device relative to a reference clock. When used as a phase-shifting device, DLL's may be quite useful.

BRIEF SUMMARY OF THE INVENTION

The present invention is a method and apparatus for creating a variable frequency signal on a semiconductor device using a variable oscillator circuit. In one embodiment, the variable oscillator circuit uses an encoded desired frequency input to determine the frequency of a ring oscillator producing a variable frequency-oscillating signal. The ring oscillator includes a base delay stage and a variable delay stage with a programmable delay magnitude defined by a delay selection signal. To ensure oscillation, there must be an odd number of logical inversions in the circuit when enabled. The variable oscillator circuit further comprises a frequency analyzer to convert the variable frequency-oscillating signal output from the ring oscillator to an encoded actual frequency signal, which indicates the frequency of the ring oscillator on an encoded bus. Also, a frequency comparator compares the encoded actual frequency signal with the encoded desired frequency input to generate a frequency deviation result and a frequency modifier, and a delay selection signal to modify the programmable delay magnitude in the variable delay stage of the ring oscillator.

In another embodiment of the present invention, a sample clock oscillator is added to the circuit creating an independent clock for analyzing the frequency of the ring oscillator. The independent sample clock runs at a greater frequency than the ring oscillator so the frequency analyzer can determine and create an accurate version of the encoded actual frequency signal for comparison to the encoded desired frequency input. This embodiment allows a large dynamic range of ring oscillator frequencies to be detectable by the frequency analyzer.

In another embodiment of the present invention, an encoded desired frequency input is not used to determine the frequency of the ring oscillator. Instead, an input reference clock is connected to a second frequency analyzer to develop an encoded desired frequency signal. The frequency comparator then compares this encoded desired frequency signal to the encoded actual frequency signal generated by a first frequency analyzer as in the previous embodiments.

BRIEF DESCRIPTION OF THE DRAWINGS

In the drawings, which illustrate what is currently considered to be the best mode for carrying out the invention.

DETAILED DESCRIPTION OF THE INVENTION

Figure 1:
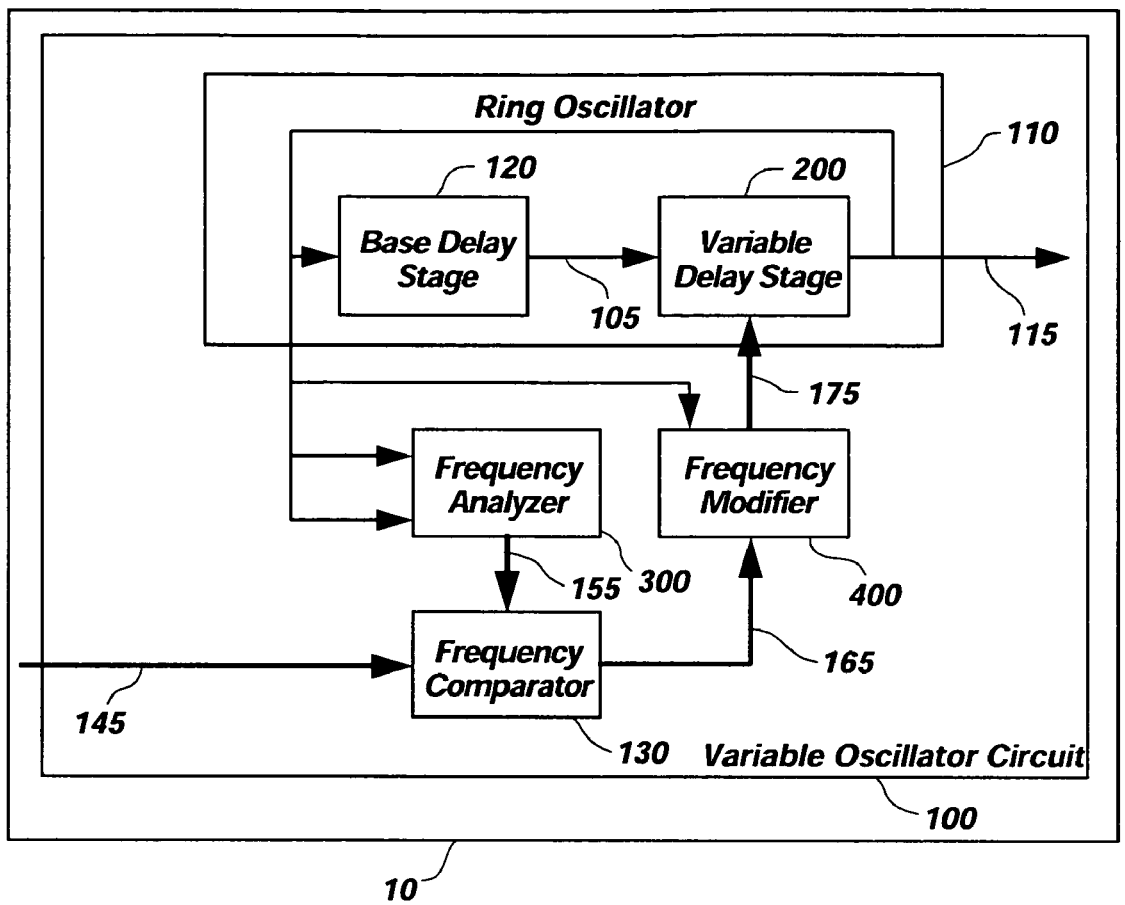
FIG. 1 is a block diagram showing a semiconductor device containing a variable oscillator circuit in accordance with an embodiment of the present invention.

FIG. 1 illustrates a variable oscillator circuit 100 contained on a semiconductor device 10 in accordance with an embodiment of the present invention. The present embodiment generates a variable frequency-oscillating signal 115 from a ring oscillator 110. The ring oscillator 110 is comprised of a base delay stage 120 and a variable delay stage 200 connected in a ring. The ring is formed by connecting the output of the base delay stage 120 to a variable delay input 105 signal and connecting the variable frequency-oscillating signal 115 back to the input of the base delay stage 120. As long as the ring is configured to have an odd number of logical inversions, the ring oscillates. An oscillation frequency of the ring varies depending on the total delay through the base delay stage 120 and the variable delay stage 200. The maximum frequency for the variable frequency-oscillating signal 115 occurs when the minimum amount of delay is selected within the variable delay stage 200. The minimum frequency for the variable frequency-oscillating signal 115 results when the maximum amount of delay is selected within the variable delay stage 200.

The base delay stage 120 in one embodiment is comprised of a single inverter. More complex base delay stages 120 are possible by adding additional elements such as logic elements, buffers, and inverters. For example, replacing the inverter in the base delay stage 120 with a simple NAND gate (not shown) allows enabling and disabling of the ring oscillator 110 using a control signal connected to one of the input terminals of the NAND gate. Clearly, more complex logic functions are also contemplated within the scope of the present invention.

Figure 2:
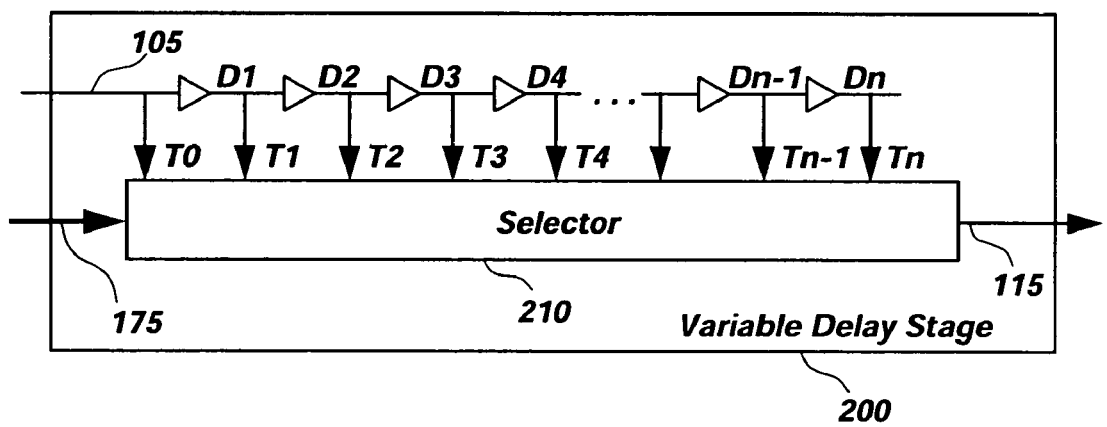
FIG. 2 is a block diagram showing a variable delay stage in accordance with an embodiment of the present invention.

One embodiment of the variable delay stage 200 is shown in FIG. 2. In this embodiment, the variable delay input 105 connects to the first element of a plurality of delay elements D1–Dn. Each of the plurality of delay elements D1–Dn connect end-to-end forming a series of sequentially delayed output taps T0–Tn. In this series of sequentially delayed output taps T0–Tn, the first tap T0 connects directly to the variable delay input 105. Each successive tap connects to the output of a delay element (i.e., D1 output connects to T1, D2 output connects to T3, Dn output connects to Tn). An input delay selection signal 175 is an encoded combination of signals used by a delay selector 210 to determine which of the series of sequentially delayed output taps T0–Tn is selected to form a programmable delay magnitude. The output of the delay selector 210 becomes the variable frequency-oscillating signal 115. Selecting the first tap (T0) in the delay selector 210 forms the fastest frequency for the ring oscillator 110. Selecting the last tap (Tn) in the delay selector 210 forms the slowest frequency for the ring oscillator 110.

A variety of encodings are possible for the delay selection signal 175. One embodiment for the delay selection signal 175 is a simple binary code useful for implementing the delay selector 210 as a simple multiplexer. For example if there are a total of 32 taps in the series of sequentially delayed output taps T0–Tn, T0 is selected by a binary encoding of 00000, T5 is selected by a binary encoding of 00101, and Tn is selected by a binary encoding of 11111. Other embodiments, with more or less delay elements and alternate encodings of the delay selection signal 175 are fully within the scope of the present invention. Additionally, the plurality of delay elements D1–Dn maybe comprised of simple buffers, or more complex circuits creating longer delays for each delay element.

Figure 3:
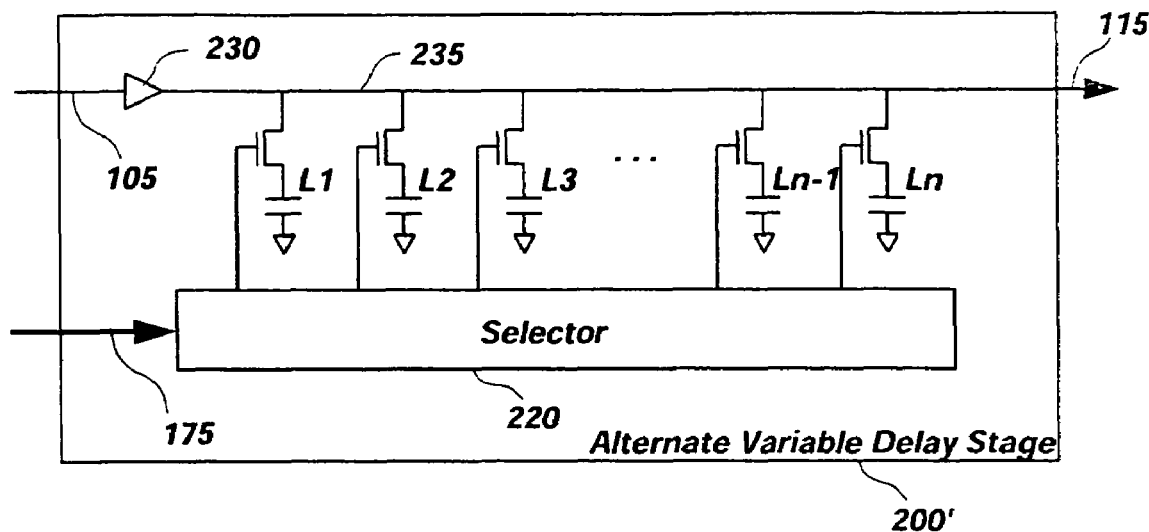
FIG. 3 is a block diagram showing a variable delay stage in accordance with another embodiment of the present invention.

An alternate embodiment of the variable delay stage 200' is shown in FIG. 3. In the present embodiment, the variable delay input 105 connects to a buffer element 230. The buffer element output signal 235 connects to a plurality of load elements L1–Ln. An input delay selection signal 175 is an encoded combination of signals used by a load selector 220 to determine which of the plurality of load elements L1–Ln are enabled onto the buffer element output signal 235. The variably loaded buffer element output signal 235 forms a programmable delay magnitude, which is output on the variable frequency-oscillating signal 115. To form the highest frequency for the ring oscillator 110, none of the plurality of load elements L1–Ln is selected by the load selector 220. To form the lowest frequency for the ring oscillator 110, all of the plurality of load elements L1–Ln are selected by the load selector 220.

FIG. 3 illustrates one embodiment of the plurality of load elements L1–Ln as a set of capacitors with one terminal connected to ground with the other ends of the capacitors connect to NMOS transistors. The NMOS transistors further connect such that all the transistor drains connect to the buffer element output signal 235 and the transistor sources each connect to one of the set of capacitors. In this configuration, each gate of an NMOS transistor connects to a load selection signals S1–Sn, wherein an active high signal on a load selection signal turns a specific NMOS transistor on and thereby connects the load capacitor to the buffer element output signal 235. A variety of encodings are possible for the delay selection signal 175. One possible embodiment is with the delay selection signal 175 representing a binary value of how many delay units to connect to the buffer element output signal 235. In an embodiment where all the plurality of load elements L1–Ln are the same value, the binary value is decoded inside the load selector 220 to enable the proper number of loads. By way of example, the binary value of 1001 may enable 9 loads and the binary value 0010 may enable 2 loads. In an embodiment where the plurality of load elements L1–Ln do not all have the same load values, the decoding may be different. For example, if L1 has a value of one unit load with L2 having a value of two unit loads, and L3 has a value of four unit loads, a binary coding might feed directly to the plurality of load elements L1–Ln. In such an embodiment, a binary value of 101 may enable L1 and L3 producing five unit loads and a binary value of 010 may enable L2 producing two unit loads. Additionally, to provide longer delay values while maintaining signal integrity, another embodiment may have a buffer followed by a set of load elements, which is in turn followed by an additional buffer followed by an additional set of load elements.

Returning to FIG. 1, the ring oscillator 110 is controlled by three functional blocks; a frequency analyzer 300, a frequency comparator 130, and a frequency modifier 400. The frequency analyzer 300 samples the variable frequency-oscillating signal 115 in a manner creating an encoded actual frequency signal 155 indicating the delay time between consecutive active edges of the variable frequency-oscillating signal 115. Depending on which edge is considered active, the frequency analyzer 300 may be configured to sample either consecutive rising edges or consecutive falling edges. Details of the frequency analyzer 300 are described below.

The frequency comparator 130 receives the encoded actual frequency signal 155 and an encoded desired frequency input 145. The encoded desired frequency input 145 may enter the semiconductor device 10 as a parallel bus, serial input, or programmable register. In general, the encoded desired frequency input 145 and the encoded actual frequency signal 155 have the same encoding and a comparison is straightforward and well known in the art. The resulting comparison is transmitted from the frequency comparator 130 as a frequency deviation result 165 signal comprised of at least two individual signals. A neutral signal on frequency deviation result 165 indicates that the encoded actual frequency signal 155 and the encoded desired frequency input 145 match, therefore no modifications to the variable frequency-oscillating signal 115 are required. When a non-neutral signal is asserted on frequency deviation result 165, then an up/down signal indicates that the frequency of the variable frequency-oscillating signal 115 should be raised or lowered.

Figure 4:
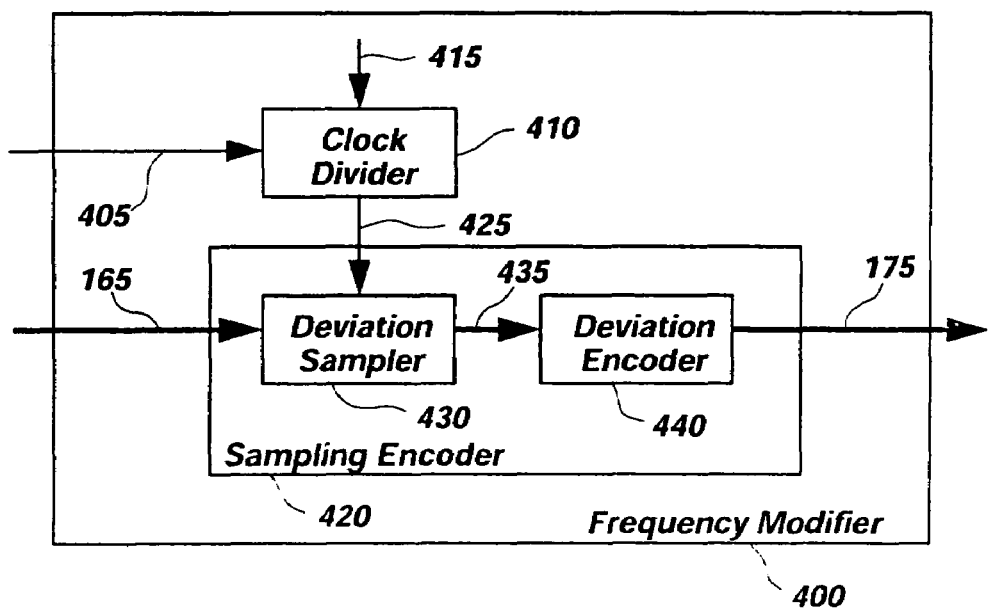
FIG. 4 is a block diagram of a frequency modifier.

The frequency modifier 400, shown in FIG. 4, samples the frequency deviation result 165 at a clock slower than the variable frequency-oscillating signal 115, then encodes the result into a delay selection signal 175 suitable for selecting the desired programmable delay magnitude in the variable delay stage 200, 200'. A clock divider 410 determines the update rate for the variable frequency-oscillating signal 115. An input divide clock 405, which is connected to the variable frequency-oscillating signal 115, drives the clock divider 410. The clock divider 410 uses a predetermined programmable rate signal 415 to divide the input divide clock 405 down creating an update rate clock 425. A deviation sampler 430 uses the update rate clock 425 to sample the frequency deviation result 165 from the frequency comparator 130 (FIG. 1) generating a sampled frequency deviation result 435. A deviation encoder 440 converts the sampled frequency deviation result 435 to the delay selection signal 175, which is encoded to select the desired programmable delay magnitude in the variable delay stage 200, 200' as discussed above. The predetermined programmable rate 415 is set to modify how often the variable frequency-oscillating signal 115 is updated affecting performance parameters such as desired frequency acquire time and jitter within the clock. If the predetermined programmable rate 415 is set to a large value, such as 1024 or greater, the variable frequency-oscillating signal 115 does not change frequency very often and thus may take many clocks to reach the desired frequency. If, on the other hand, the predetermined programmable rate 415 is set to a small value, the variable frequency-oscillating signal 115 may be changing between two discrete yet close frequencies creating jitter in the variable frequency-oscillating signal 115.

Figure 5:
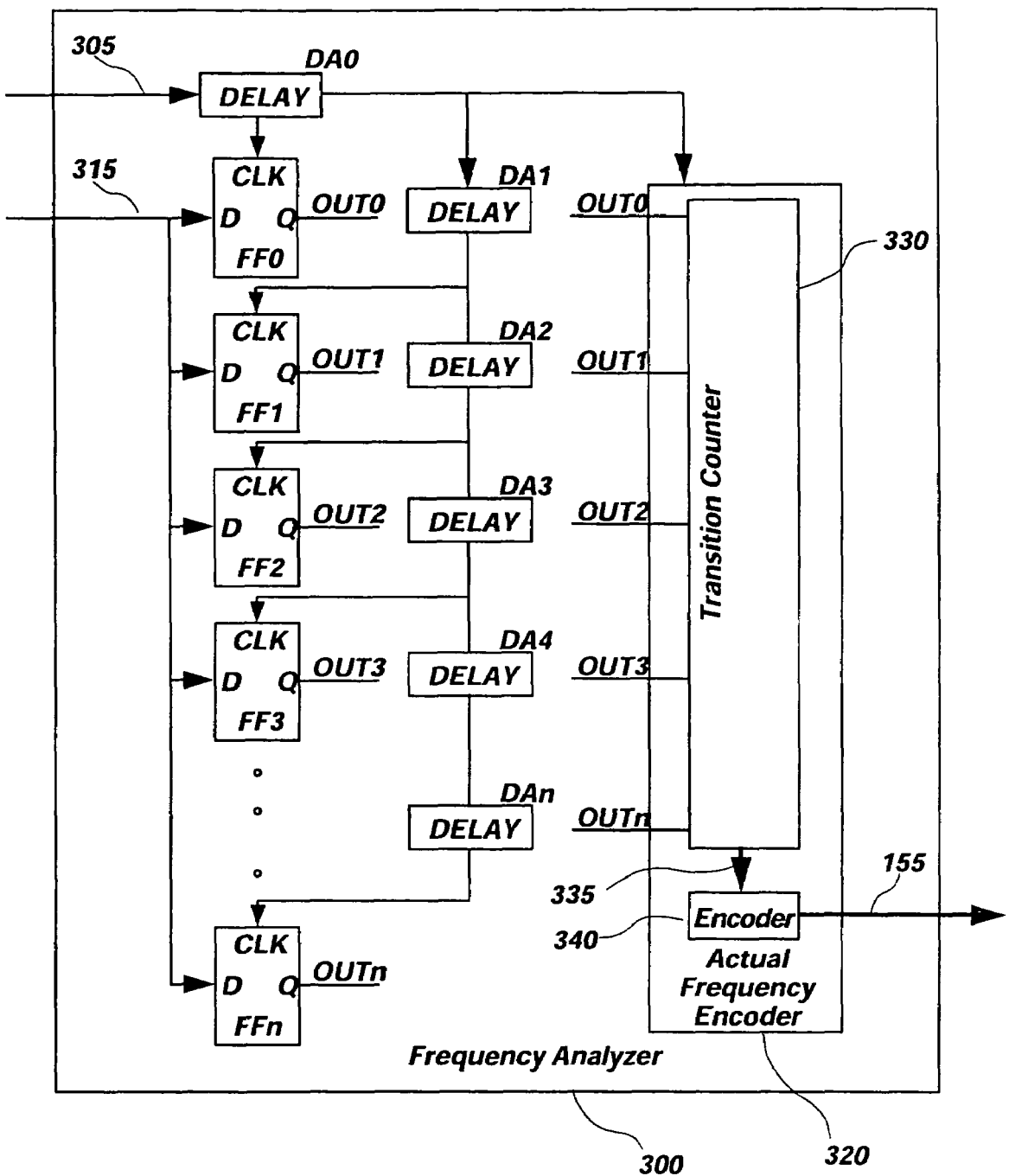
FIG. 5 is a block diagram of a frequency analyzer.

An embodiment of the frequency analyzer 300 is shown in FIG. 5. The frequency analyzer 300 uses an input sample clock 305 to sample an input reference clock 315 and generate a resulting encoded actual frequency signal 155 to drive the frequency comparator 130. In this embodiment, the input sample clock 305 and the input reference clock 315 are both driven by the variable frequency-oscillating signal 115. To accomplish the frequency analyzer 300 function, the input sample clock 305, is directed through a plurality of clock delay elements DA0–DAn connected in series to create a series of sequentially delayed clocks where each subsequent clock signal is delayed by the delay time of an individual element in the plurality of clock delay elements DA0–DAn. An input reference clock 315 is connected to a plurality of sample elements FF0–FFn, which are clocked by the series of sequentially delayed clocks to create a plurality of sequentially delayed clock samples OUT0–OUTn. Each of the plurality of sequentially delayed clock samples OUT0–OUTn connect to a transition counter 330 in an actual frequency encoder 320.

Figure 6:
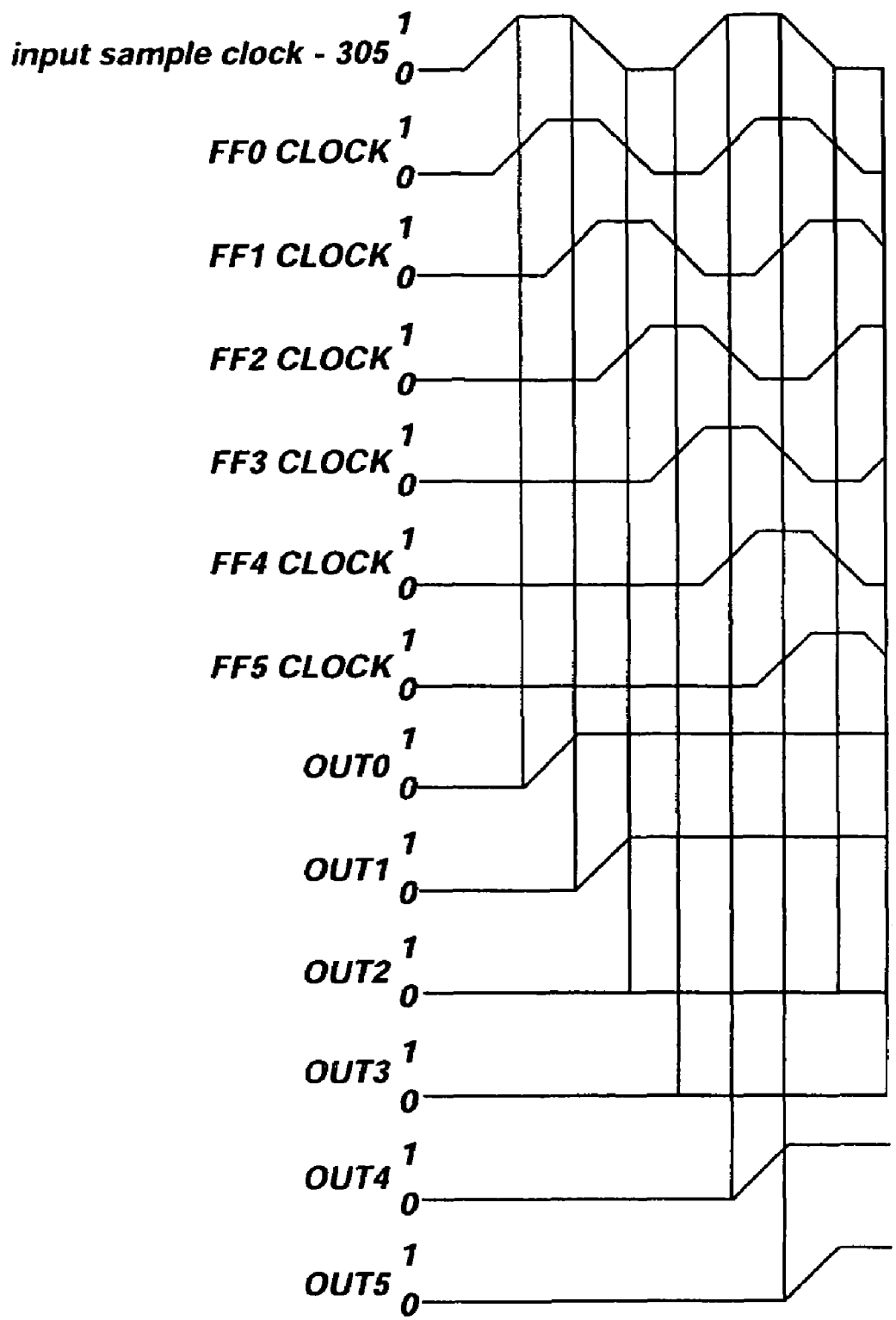
FIG. 6 is a timing diagram of at least a position of the frequency analyzer elements.

The transition counter 330 counts the number of delay elements between successive active edges of the input reference clock 315. FIG. 6 illustrates example timing for the series of sequentially delayed clocks as FF0 clock through FF5 clock and the plurality of sequentially delayed clock samples OUT0–OUTn shown as OUT0 through OUT4. The transition counter 330 operates by triggering the counter on the rising edge of the OUT0 signal. Next, each of the plurality of sequentially delayed clock samples OUT0–OUTn is counted until a delayed clock sample is detected that does not transition for low to high. Finally, delayed clock samples are counted until another delayed clock sample with a low to high transition is detected. For example, in FIG. 6, the counter is armed when OUT0 transitions from low to high. Next, OUT2 is the first delayed clock sample that does not make a transition, which arms the counter to begin looking for the next low to high transition on subsequent delayed clock sample. The next low to high transition occurs on OUT4, giving a delay count 335 of four between active edges. The encoder 340 takes the delay count 335 and encodes it into the encoded actual frequency signal 155, which is transmitted to the frequency comparator 130.

The unit value of a delay element within the plurality of clock delay elements DA0–DAn defines the granularity of measurement values possible for the frequency of the input reference clock 315. To enhance accurate sampling of the input reference clock 315, it is desirable to have at least four delay elements between successive active edges of the input reference clock 315 such that an active transition, followed by no transition, followed by an active transition is detected. For example, if each delay element is 250 picoseconds, four delay elements equal 1.0 nanosecond, translating into a maximum detectable frequency of 1.0 Gigahertz. This also assumes a near 50% duty cycle such that the inactive period of the clock is sampled. With other duty cycles, a larger number of delay elements between active edges may be required. The total number of elements in the plurality of clock delay elements DA0–DAn determine the minimum detectable frequency on the input sample clock 305. Again, if an individual delay element is 250 picoseconds, 32 delay elements equal 8.0 nanoseconds, translating into a minimum detectable frequency of 125 Megahertz.

Figure 7:
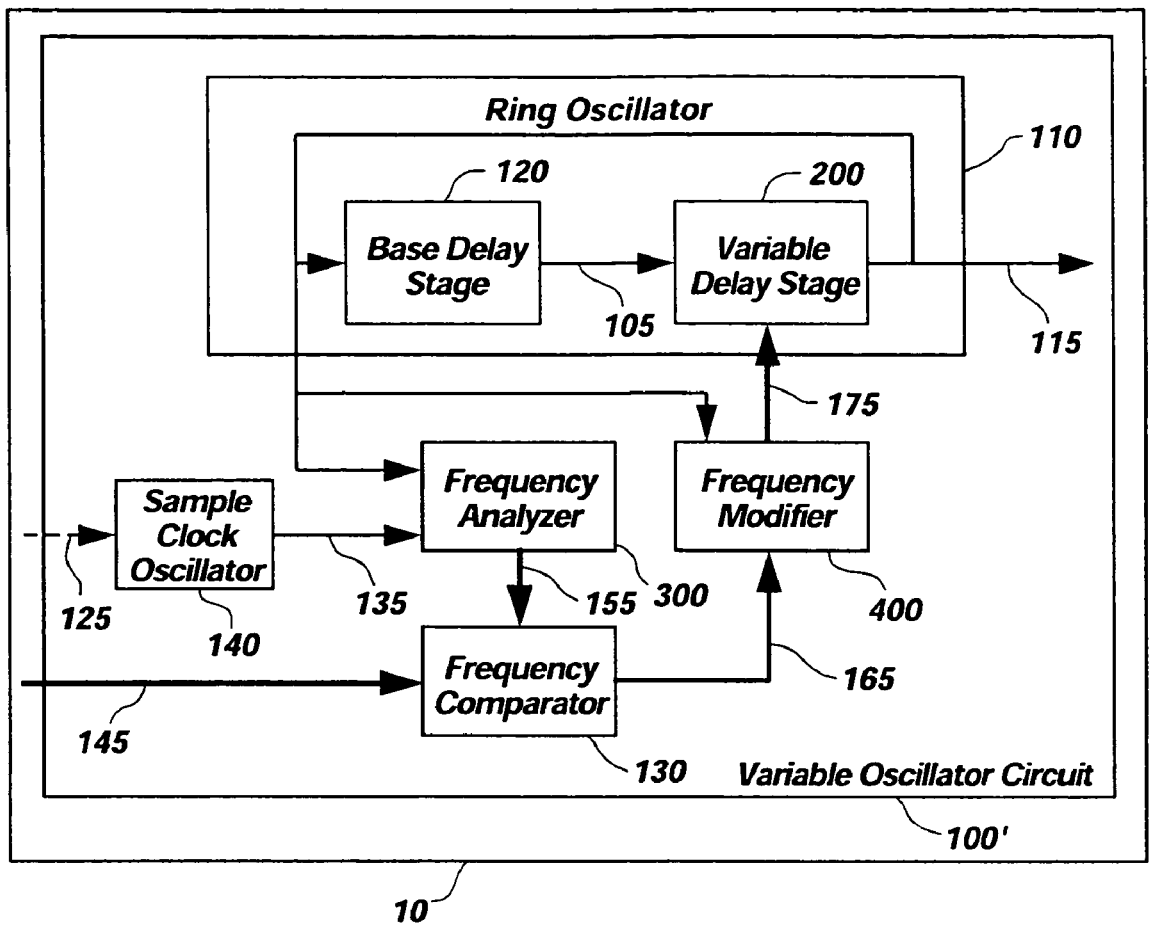
FIG. 7 is a block diagram showing a semiconductor device including a variable oscillator circuit in accordance with another embodiment of the present invention.

FIG. 7 illustrates an alternate embodiment of a variable oscillator circuit 100. In this embodiment, the ring oscillator 110, base delay stage 120, variable delay stage 200, frequency modifier 400, and frequency comparator 130 operate the same as described in the previous embodiment. However, the present embodiment contemplates an additional high frequency sample clock oscillator 140 used as an independent sample clock when analyzing the frequency of the variable frequency-oscillating signal 115. An optional encoded calibration input 125, modifies the sample clock frequency 135 generated by the sample clock oscillator 140. The encoded calibration input 125 may enter the semiconductor device 10 as a parallel bus, serial input, or programmable register. The sample clock frequency 135 may be adjusted for various process, temperature, and voltage changes, as well as different desired operational points using the encoded calibration input 125. In this embodiment, the frequency analyzer 300, shown in FIG. 5 and described above connects in a slightly different fashion. The variable frequency-oscillating signal 115 still connects to the input reference clock 315 in the frequency analyzer 300 as the clock to be sampled, however in this embodiment, the sample clock frequency 135 connects to the input sample clock 305. This embodiment creates an input sample clock 305 independent from the input reference clock 315.

Figure 8:
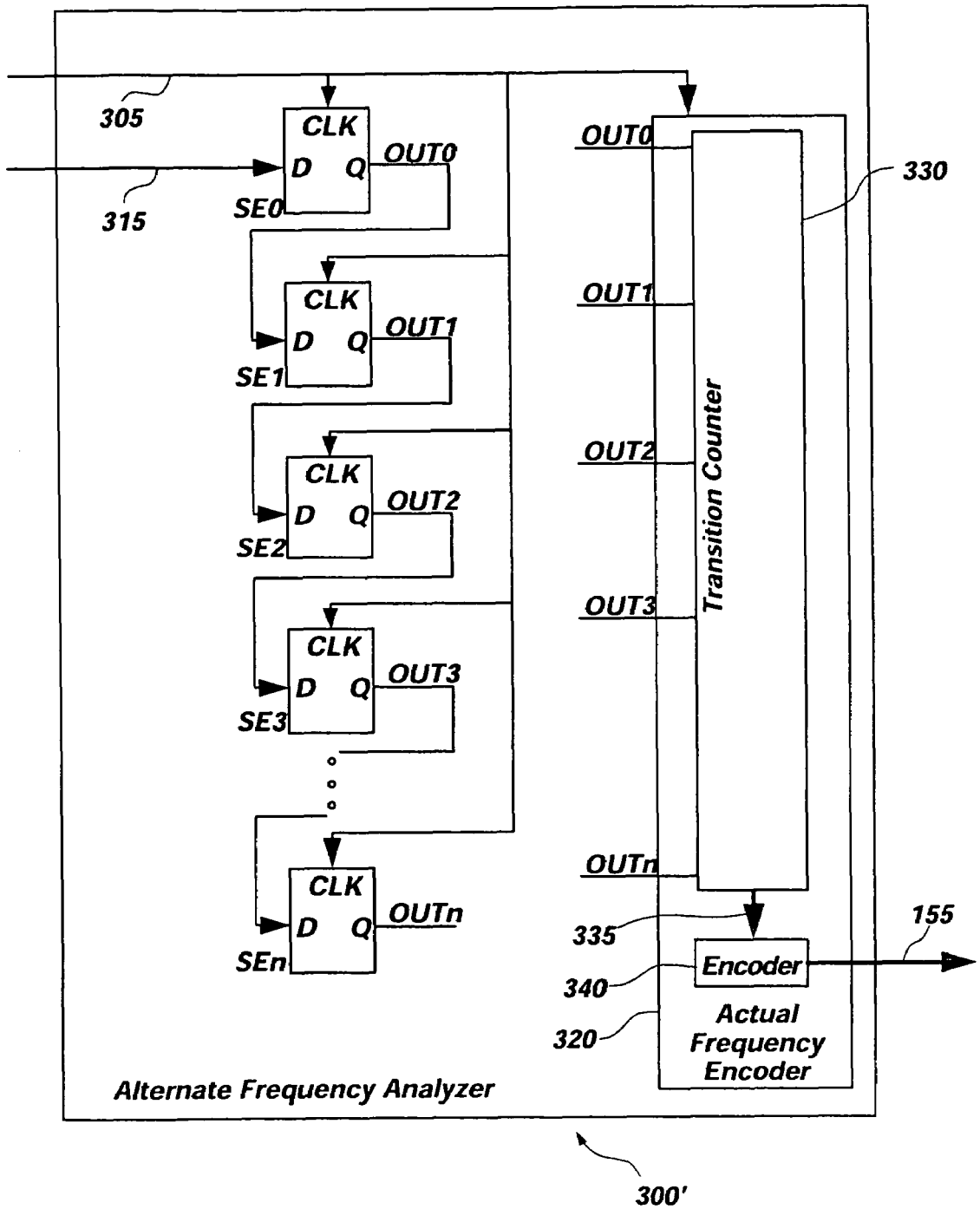
FIG. 8 is a block diagram showing an alternate embodiment of a frequency analyzer in accordance with another embodiment of the present invention.

In another embodiment, the variable oscillator circuit 100 in FIG. 7 uses an alternate embodiment of the frequency analyzer 300' shown in FIG. 8. This embodiment uses a sample clock oscillator 140 to generate a sample clock frequency 135 similar to the previous embodiment. Also, as in the previous embodiment, the variable frequency-oscillating signal 115 connects to the input reference clock 315 in the alternate frequency analyzer 300' and the sample clock frequency 135 connects to the input sample clock 305. However, the alternate frequency analyzer 300' detects the frequency of the input reference clock 315 in a different manner. In the alternate frequency analyzer 300', the input sample clock 305 connects directly to the clock signal of each of a plurality of sample elements SE0–SEn. The plurality of sample elements SE0–SEn are connected in series in the manner of a shift register with the input reference clock 315 as the input to the first element in the shift register. This configuration creates a plurality of sequentially delayed clock samples OUT0–OUTn where each subsequent delayed clock sample is delayed by one clock period of the input sample clock 305. The actual frequency encoder 320, transition counter 330, and encoder 340 in the alternate frequency analyzer 300' operate similarly to the first frequency analyzer 300.

In the alternate frequency analyzer 300', the granularity of measurement values possible for the frequency of the input reference clock 315 is related to the frequency of the input sample clock 305. To ensure accurate sampling of the input reference clock 315 there should be at least four sample elements between successive active edges of the input reference clock 315 such that an active transition, followed by no transition, followed by an active transition is detected. For example, if the input sample clock 305 has a frequency of 2.0 Gigahertz, four sample elements would allow for a maximum detectable frequency of 500 Megahertz. This also assumes a near 50% duty cycle such that the inactive period of the clock is sampled. With other duty cycles, a larger number of clock cycles between active edges may be required. The total number of elements in the plurality of sample elements SE0–SEn determine the minimum detectable frequency on the input sample clock 305. For example, with the input sample clock 305 running at 2.0 Gigahertz and 32 sample elements the minimum detectable frequency is 62.5 Megahertz. Clearly, the alternate frequency analyzer 300' cannot detect frequencies as high as the first frequency analyzer 300 due to the difference between a using a clock in shift register fashion rather than a series of delayed versions of a clock. The delays can be tuned to a much smaller time increment than the frequency of an oscillator. However, the alternate frequency analyzer 300' allows for a much larger dynamic range of detectable frequencies. For example, using 32 sample elements and reprogramming the sample clock frequency 135 to 800 Megahertz allows detection of an input reference clock 315 between 200 Megahertz and 25 Megahertz.

Figure 9:
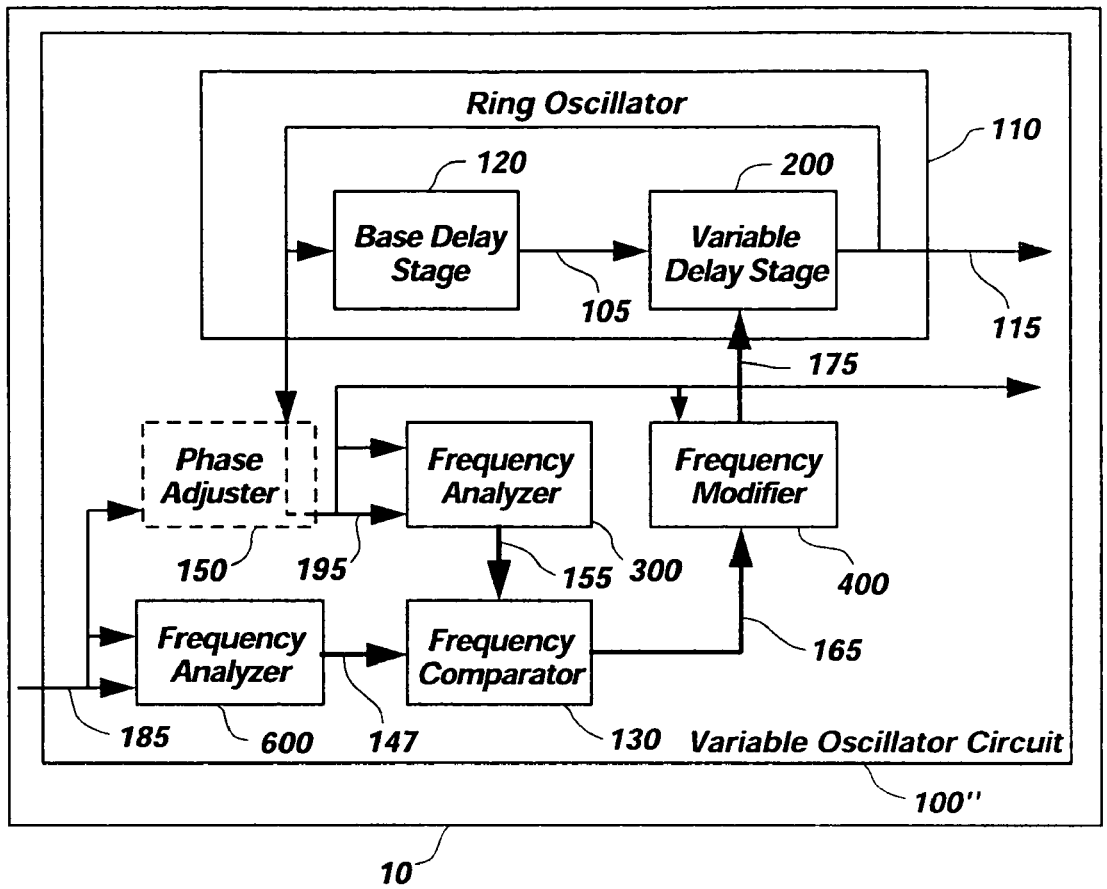
FIG. 9 is a block diagram showing a semiconductor device containing a variable oscillator circuit in accordance with an embodiment of the present invention.

Another embodiment of the variable oscillator circuit 100, shown in FIG. 9, is useful for synchronizing multiple semiconductor devices 10 with the same variable frequency-oscillating signal 115. In this embodiment, the ring oscillator 110, base delay stage 120, variable delay stage 200, frequency modifier 400, and frequency comparator 130 operate the same as described in the previous embodiments. The present embodiment, shown in FIG. 9, is similar to the embodiment shown in FIG. 1, except the encoded desired frequency input 145 to the frequency comparator 130 is not used. Rather, a reference input clock 185 drives a second frequency analyzer 600 developing an encoded desired frequency signal 147 for use in the frequency comparator 130. The second frequency analyzer 600 is the same as the first frequency analyzer 300 as shown in FIG. 5. However, the variable frequency-oscillating signal 115 drives the first frequency analyzer 300 and the reference input clock 185 drives the second frequency analyzer 600. The result is a variable frequency-oscillating signal 115 running at the same frequency as the reference input clock 185.

Optionally, if a phase matched variable frequency-oscillating signal 115 is desired a phase adjuster 150 may be inserted. The phase adjuster 150 uses a typical DLL well known in the art to compare the variable frequency-oscillating signal 115 to the reference input clock 185. A phase adjusted variable frequency-oscillating signal 195 is generated matching the phase of the reference input clock 185.

Figure 10:
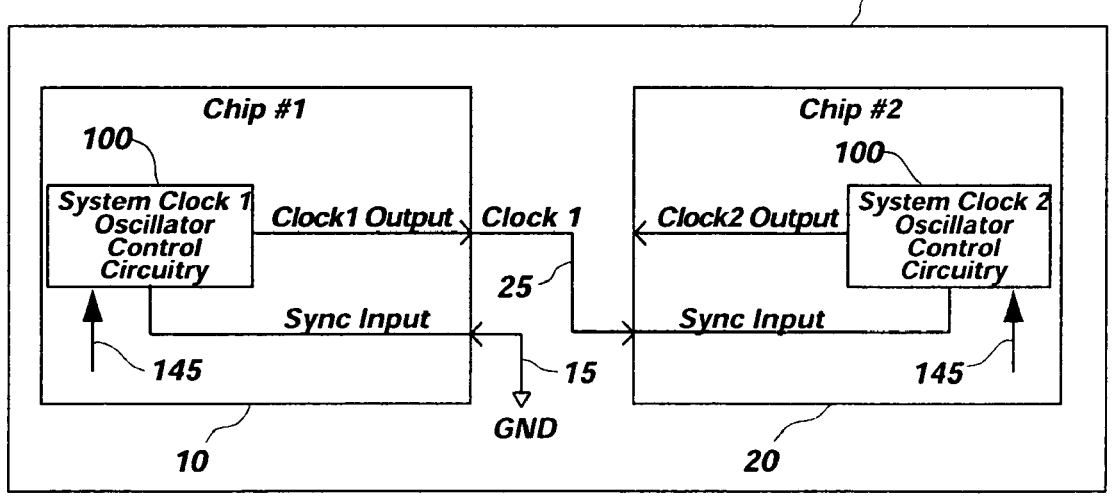
FIG. 10 is a system block diagram showing two semiconductor devices for generating synchronized versions of a variable frequency-oscillating signal in each semiconductor device.

A plurality of semiconductor devices 10 maybe connected using this embodiment to create a system of semiconductor devices 10 running at the same frequency. FIG. 10 shows an example system 520 with a first semiconductor device 10 and a second semiconductor device 20. The reference input clock 185 on the first semiconductor device 10 is tied to ground, indicating that an embodiment of the variable oscillator circuit 100 shown in FIG. 7 is used to generate the variable frequency-oscillating signal 115 as an output connected to clock1 25. The encoded desired frequency input 145 selects the operating frequency of the variable frequency-oscillating signal 115 in the first semiconductor device 10. Clock1 25 connects to the reference input clock 185 on the second semiconductor device 20. The embodiment of the variable oscillator circuit 100 shown in FIG. 9 is used to generate a variable frequency-oscillating signal 115 in the second semiconductor device 20 matching the reference input clock 185 and thus the variable frequency-oscillating signal 115 in the first semiconductor device 10. The encoded desired frequency input 145 in the second semiconductor device 20 is not used.

Specific embodiments have been shown by way of example in the drawings and have been described in detail herein, however the invention may be susceptible to additional various modifications and alternative forms. It should be understood that the invention is not intended to be limited to the particular forms disclosed. Rather, the invention includes all modifications, equivalents, and alternatives falling within the spirit and scope of the invention as defined by the following appended claims.

What is claimed is:

1. A variable oscillator circuit on a semiconductor device, comprising:
   a sample clock oscillator having a sample clock frequency;
   a ring oscillator for producing a variable frequency-oscillating signal including:
      a base delay stage; and
      a variable delay stage having a delay selection signal that selects a programmable delay magnitude, wherein
      the base delay stage and the variable delay stage connect in a ring having an odd number of logical inversions;
   a frequency analyzer operating at the sample clock frequency for converting the variable frequency-oscillating signal to an encoded actual frequency signal;
   a frequency comparator wherein the encoded actual frequency signal is compared to an encoded desired frequency input to generate a frequency deviation result; and
   a frequency modifier for generating the delay selection signal based on the frequency deviation result.

2. The circuit of claim 1, further comprising an encoded calibration input wherein the encoded calibration input produces variations in the frequency of the sample clock oscillator.

3. The circuit of claim 1, wherein the variable delay stage comprises:
   a plurality of delay elements connected in series producing a series of sequentially delayed output taps; and
   a delay selector for creating the programmable delay magnitude by selecting one of the series of sequentially delayed output taps based on the delay selection signal.

4. The circuit of claim 1, wherein the variable delay stage comprises:
- a buffer element having a buffer element output signal;
- a plurality of load elements connected in parallel to the buffer element output signal; and
- a load selector for creating the programmable delay magnitude by enabling connection of a variable number of the plurality of load elements to the buffer element output signal based on the delay selection signal.

5. The circuit of claim 1, wherein the frequency modifier comprises:
- an input divide clock operably coupled to the variable frequency-oscillating signal;
- a clock divider for determining an update rate to the variable frequency-oscillating signal by dividing the input divide clock by a predetermined programmable rate;
- a deviation sampler for generating a sampled frequency deviation result based on sampling the frequency deviation result at the update rate; and
- a deviation encoder for generating the delay selection signal based on the sampled frequency deviation result.

6. The circuit of claim 1, wherein the frequency analyzer comprises:
- an input sample clock operably coupled to the sample clock frequency;
- an input reference clock operably coupled to the variable frequency-oscillating signal;
- a clock sampler comprising:
  - a plurality of clock delay elements operably coupled to the input sample clock and connected in series producing a series of sequentially delayed clocks; and
  - a plurality of sample elements each of the plurality of sample elements using one of the series of sequentially delayed clocks to sample the input reference clock and producing a plurality of sequentially delayed clock samples; and
- an actual frequency encoder comprising:
  - a transition counter for producing a delay count indicating the number of the plurality of sequentially delayed clock samples between two consecutive active edges; and
  - an encoder for converting the delay count to the encoded actual frequency signal.

7. The circuit of claim 1, wherein the frequency analyzer comprises:
- an input sample clock operably coupled to the sample clock frequency;
- an input reference clock operably coupled to the variable frequency-oscillating signal;
- a clock sampler comprising, a plurality of sample elements connected in series using the input reference clock to sample the input reference clock and producing a plurality of sequentially delayed clock samples; and
- an actual frequency encoder comprising:
  - a transition counter for producing a delay count indicating the number of the plurality of sequentially delayed clock samples between two consecutive active edges; and
  - an encoder for converting the delay count to the encoded actual frequency signal.

8. A variable oscillator circuit on a semiconductor device, comprising:
- a reference input clock;
- a ring oscillator producing a variable frequency-oscillating signal including:
  - a base delay stage; and
  - a variable delay stage having a delay selection signal that selects a programmable delay magnitude, wherein
    the base delay stage and the variable delay stage connect in a ring having an odd number of logical inversions;
- a first frequency analyzer for converting the variable frequency-oscillating signal to an encoded actual frequency signal;
- a second frequency analyzer for converting the reference input clock to an encoded desired frequency signal;
- a frequency comparator wherein the encoded actual frequency signal is compared to the encoded desired frequency signal to generate a frequency deviation result; and
- a frequency modifier for generating the delay selection signal based on the frequency deviation result.

9. The circuit of claim 8, further comprising a phase adjuster for producing a phase adjusted variable frequency-oscillating signal by modifying the phase delay of the variable frequency-oscillating signal to match the phase of the reference input clock.

10. The circuit of claim 8, wherein the variable delay stage comprises:
- a plurality of delay elements connected in series producing a series of sequentially delayed output taps; and
- a delay selector for creating the programmable delay magnitude by selecting one of the series of sequentially delayed output taps based on the delay selection signal.

11. The circuit of claim 8, wherein the variable delay stage comprises:
- a buffer element having a buffer element output signal;
- a plurality of load elements connected in parallel to the buffer element output signal; and
- a load selector for creating the programmable delay magnitude by enabling connection of a variable number of the plurality of load elements to the buffer element output signal based on the delay selection signal.

12. The circuit of claim 8, wherein the frequency modifier comprises:
- an input divide clock operably coupled to the variable frequency-oscillating signal;
- a clock divider for determining an update rate to the variable frequency-oscillating signal by dividing the input divide clock by a predetermined programmable rate;
- a deviation sampler for generating a sampled frequency deviation result based on sampling the frequency deviation result at the update rate; and
- a deviation encoder for generating the delay selection signal based on the sampled frequency deviation result.

13. The circuit of claim 8, wherein the first frequency analyzer comprises:
- an input sample clock operably coupled to the variable frequency-oscillating signal;
- an input reference clock operably coupled to the variable frequency-oscillating signal;
- a clock sampler comprising:
  - a plurality of clock delay elements operably coupled to the input sample clock and connected in series producing a series of sequentially delayed clocks; and
  - a plurality of sample elements each of the plurality of sample elements using one of the series of sequentially delayed clocks to sample the input reference clock and producing a plurality of sequentially delayed clock samples; and an actual frequency encoder comprising:
a transition counter for producing a delay count indicating the number of the plurality of sequentially delayed clock samples between two consecutive active edges; and
an encoder for converting the delay count to the encoded actual frequency signal.

14. The circuit of claim 8, wherein the second frequency analyzer comprises:
a second input sample clock operably coupled to the reference input clock;
a second input reference clock operably coupled to the reference input clock;
a second clock sampler comprising:
a second plurality of clock delay elements operably coupled to the second input sample clock and connected in series producing a second series of sequentially delayed clocks; and
a second plurality of sample elements each of the second plurality of sample elements using one of the second series of sequentially delayed clocks to sample the second input reference clock and producing a second plurality of sequentially delayed clock samples; and
a second actual frequency encoder comprising:
a second transition counter for producing a second delay count indicating the number of the second plurality of sequentially delayed clock samples between two consecutive active edges; and
a second encoder for converting the second delay count to the encoded desired frequency signal.

15. A system of synchronized semiconductor devices comprising:
a first semiconductor device comprising:
a ring oscillator producing a variable frequency-oscillating signal including:
a base delay stage; and
a variable delay stage having a delay selection signal that selects a programmable delay magnitude, wherein
the base delay stage and the variable delay stage connect in a ring having an odd number of logical inversions;
a frequency analyzer for converting the variable frequency-oscillating signal to an encoded actual frequency signal;
a frequency comparator wherein the encoded actual frequency signal is compared to an encoded desired frequency input to generate a frequency deviation result; and
a frequency modifier for generating the delay selection signal based on the frequency deviation result; and
at least one additional semiconductor device comprising:
a reference input clock connected to the variable frequency-oscillating signal of the first semiconductor device;
an additional ring oscillator producing an additional variable frequency-oscillating signal including:
an additional base delay stage; and
an additional variable delay stage having an additional delay selection signal that selects an additional programmable delay magnitude, wherein the additional base delay stage and the additional variable delay stage connect in a ring having an odd number of logical inversions;
a first frequency analyzer for converting the additional variable frequency-oscillating signal to an additional encoded actual frequency signal;
a second frequency analyzer for converting the reference input clock to an encoded desired frequency signal;
a frequency comparator wherein the additional encoded actual frequency signal is compared to the encoded desired frequency signal to generate an additional frequency deviation result; and
an additional frequency modifier for generating the additional delay selection signal based on the additional frequency deviation result.

16. A method for modifying a frequency of an oscillating signal comprising:
generating a sample clock frequency using a sample clock oscillator;
generating a variable frequency-oscillating signal using a ring oscillator having a programmable delay magnitude;
analyzing the variable frequency-oscillating signal using the sample clock frequency to develop an encoded actual frequency signal;
comparing the encoded actual frequency signal to an encoded desired frequency input to generate a frequency deviation result; and
modifying the programmable delay magnitude and thereby the variable frequency-oscillating signal based on the frequency deviation result.

17. A variable oscillator circuit on a semiconductor device, comprising:
a means for generating a sample clock frequency;
a means for producing a variable frequency-oscillating wherein the frequency is varied based on a delay selection signal;
a means for analyzing the frequency of the variable frequency-oscillating signal operating at the sample clock frequency and converting the analysis results to an encoded actual frequency signal;
a means for comparing the encoded actual frequency signal to an encoded desired frequency input and generating a frequency deviation result; and
a means for generating the delay selection signal based on the frequency deviation result.

18. A variable oscillator circuit on a semiconductor device, comprising:
a means for producing a variable frequency-oscillating wherein the frequency is varied based on a delay selection signal;
a means for analyzing the frequency of the variable frequency-oscillating signal and converting the analysis results to an encoded actual frequency signal;
a means for analyzing the frequency of a reference input clock and converting the analysis results to an encoded desired frequency signal;
a means for comparing the encoded actual frequency signal to the encoded desired frequency input and generating a frequency deviation result; and
a means for generating the delay selection signal based on the frequency deviation result.

* * * * *